US009693068B2

(12) United States Patent
Groepl et al.

(10) Patent No.: US 9,693,068 B2
(45) Date of Patent: Jun. 27, 2017

(54) CIRCUIT ARRANGEMENT AND METHOD FOR CODING AND/OR DECODING

(71) Applicant: SILICON LINE GMBH, Munich (DE)

(72) Inventors: Martin Groepl, Sonthofen/Oberallgau (DE); Thomas Suttorp, Munich (DE); Florian Jansen, Munich (DE)

(73) Assignee: SILICON LINE GMBH, Munich (DE)

( * ) Notice: Subject to any disclaimer, the term of this patent is extended or adjusted under 35 U.S.C. 154(b) by 358 days.

(21) Appl. No.: 14/181,471

(22) Filed: Feb. 14, 2014

(65) Prior Publication Data

US 2015/0049820 A1 Feb. 19, 2015

Related U.S. Application Data

(63) Continuation of application No. PCT/DE2012/200056, filed on Aug. 16, 2012.

(30) Foreign Application Priority Data

Aug. 16, 2011 (DE) .................. 10 2011 052 766

(51) Int. Cl.
| | |
|---|---|
| *H04N 19/176* | (2014.01) |
| *H04N 19/42* | (2014.01) |
| *H03M 5/14* | (2006.01) |

(52) U.S. Cl.
CPC .......... *H04N 19/176* (2014.11); *H03M 5/145* (2013.01); *H04N 19/42* (2014.11)

(58) Field of Classification Search
None
See application file for complete search history.

(56) References Cited

U.S. PATENT DOCUMENTS

| | | | | |
|---|---|---|---|---|
| 4,665,517 A | * | 5/1987 | Widmer | H04L 25/4906 370/452 |
| 4,759,018 A | * | 7/1988 | Buchner | H04J 3/0605 370/535 |
| 5,245,339 A | * | 9/1993 | Cideciyan | G11B 20/1426 341/106 |
| 5,387,911 A | * | 2/1995 | Gleichert | H04L 25/4908 341/58 |
| 5,612,694 A | * | 3/1997 | Jedwab | H03M 5/145 341/58 |
| 5,648,776 A | * | 7/1997 | Widmer | H03M 9/00 341/100 |

(Continued)

OTHER PUBLICATIONS

International Search Report; PCT/DE2012/200056; Mar. 4, 2013.

*Primary Examiner* — Mohammad J Rahman
(74) *Attorney, Agent, or Firm* — Studebaker & Brackett PC

(57) ABSTRACT

In order to further develop a circuit arrangement provided for coding and/or decoding a data stream, in particular of up to 24-bit-wide R[ed]G[reen]B[lue] video signals, and a corresponding method in such way that an efficient DC-balanced coding and/or decoding is possible, in particular with the lowest possible overheads,

- at least one coder
  - with five 5b/6b coder blocks arranged in parallel to each other and
  - with a 2b/2b coder block arranged in parallel to the 5b/6b coder blocks, and/or
- at least one decoder
  - with five 6b/5b decoder blocks arranged in parallel to each other and
  - with a 2b/2b decoder block arranged in parallel to the 6b/5b decoder blocks are proposed.

13 Claims, 4 Drawing Sheets

(56) References Cited

U.S. PATENT DOCUMENTS

| | | | | |
|---|---|---|---|---|
| 5,663,724 A | * | 9/1997 | Westby | H03M 5/145 341/106 |
| 5,784,409 A | * | 7/1998 | Coles | H04L 25/4925 341/56 |
| 5,835,498 A | * | 11/1998 | Kim | G06F 13/4018 348/423.1 |
| 5,974,464 A | * | 10/1999 | Shin | G09G 5/006 341/58 |
| 6,111,528 A | | 8/2000 | Bagley | |
| 6,295,010 B1 | | 9/2001 | Thiesfeld | |
| 6,496,540 B1 | * | 12/2002 | Widmer | H03M 5/04 341/59 |
| 7,064,683 B1 | * | 6/2006 | Westby | H03M 7/06 341/50 |
| 7,123,173 B1 | * | 10/2006 | Grivna | H03M 5/06 341/58 |
| 7,292,161 B2 | * | 11/2007 | Widmer | H03M 7/04 341/58 |
| 7,359,437 B2 | * | 4/2008 | Hwang | H04L 1/0057 348/423.1 |
| 2003/0048851 A1 | * | 3/2003 | Hwang | H04L 1/0057 375/240.26 |
| 2004/0083419 A1 | * | 4/2004 | Chiba | H03M 7/20 714/799 |
| 2005/0062621 A1 | * | 3/2005 | Widmer | H03M 5/145 341/58 |
| 2007/0075735 A1 | * | 4/2007 | Arora | H04L 25/4908 326/41 |
| 2008/0180287 A1 | * | 7/2008 | Widmer | H03M 7/20 341/95 |
| 2009/0323831 A1 | | 12/2009 | Kirkpatrick | |

* cited by examiner

| ABCDE | Primary abcdei | Alternate abcdei |
|---|---|---|
| 00000 | 011000 | 100111 |
| 10000 | 100010 | 011101 |
| 01000 | 010010 | 101101 |
| 11000 | 110001 | |
| 00100 | 001010 | 110101 |
| 10100 | 101001 | |
| 01100 | 011001 | |
| 11100 | 111000 | 000111 |
| 00010 | 000110 | 111001 |
| 10010 | 100101 | |
| 01010 | 010101 | |
| 11010 | 110100 | |
| 00110 | 001101 | |
| 10110 | 101100 | |
| 01110 | 011100 | |
| 11110 | 101000 | 010111 |
| 00001 | 011011 | 100100 |
| 10001 | 100011 | |
| 01001 | 010011 | |
| 11001 | 110010 | |
| 00101 | 001011 | |
| 10101 | 101010 | |
| 01101 | 011010 | |
| 11101 | 111010 | 000101 |
| 00011 | 001100 | 110011 |
| 10011 | 100110 | |
| 01011 | 010110 | |
| 11011 | 110110 | 001001 |
| 00111 | 001110 | |
| 10111 | 101110 | 010001 |
| 01111 | 011110 | 100001 |
| 11111 | 101011 | 010100 |

Fig. 2

| A B | Primary a b | Alternate a b |
|---|---|---|
| 0 0 | 0 0 | 1 1 |
| 0 1 | 0 1 | |
| 1 0 | 1 0 | |
| 1 1 | - | |

Fig. 3A

| A B | Primary a b | Alternate a b |
|---|---|---|
| 0 0 | - | |
| 0 1 | 0 0 | 1 1 |
| 1 0 | 0 1 | |
| 1 1 | 1 0 | |

| A B | Primary a b | Alternate a b |
|---|---|---|
| 0 0 | 1 0 | |
| 0 1 | - | |
| 1 0 | 0 0 | 1 1 |
| 1 1 | 0 1 | |

| A B | Primary a b | Alternate a b |
|---|---|---|
| 0 0 | 0 1 | |
| 0 1 | 1 0 | |
| 1 0 | - | |
| 1 1 | 0 0 | 1 1 |

| A B | Primary a b | Alternate a b |
|---|---|---|
| 0 0 | 0 0 | 1 1 |
| 0 1 | 0 1 | |
| 1 0 | - | |
| 1 1 | 1 0 | |

| A B | Primary a b | Alternate a b |
|---|---|---|
| 0 0 | 1 0 | |
| 0 1 | 0 0 | 1 1 |
| 1 0 | 0 1 | |
| 1 1 | - | |

| A B | Primary a b | Alternate a b |
|---|---|---|
| 0 0 | - | |
| 0 1 | 1 0 | |
| 1 0 | 0 0 | 1 1 |
| 1 1 | 0 1 | |

| A B | Primary a b | Alternate a b |
|---|---|---|
| 0 0 | 0 1 | |
| 0 1 | - | |
| 1 0 | 1 0 | |
| 1 1 | 0 0 | 1 1 |

| A B | Primary a b | Alternate a b |
|---|---|---|
| 0 0 | 0 0 | 1 1 |
| 0 1 | 1 0 | |
| 1 0 | 0 1 | |
| 1 1 | - | |

| A B | Primary a b | Alternate a b |
|---|---|---|
| 0 0 | - | |
| 0 1 | 0 0 | 1 1 |
| 1 0 | 1 0 | |
| 1 1 | 0 1 | |

| A B | Primary a b | Alternate a b |
|---|---|---|
| 0 0 | 0 1 | |
| 0 1 | - | |
| 1 0 | 0 0 | 1 1 |
| 1 1 | 1 0 | |

| A B | Primary a b | Alternate a b |
|---|---|---|
| 0 0 | 1 0 | |
| 0 1 | 0 1 | |
| 1 0 | - | |
| 1 1 | 0 0 | 1 1 |

| A B | Primary a b | Alternate a b |
|---|---|---|
| 0 0 | 0 0 | 1 1 |
| 0 1 | 1 0 | |
| 1 0 | - | |
| 1 1 | 0 1 | |

| A B | Primary a b | Alternate a b |
|---|---|---|
| 0 0 | 0 1 | |
| 0 1 | 0 0 | 1 1 |
| 1 0 | 1 0 | |
| 1 1 | - | |

| A B | Primary a b | Alternate a b |
|---|---|---|
| 0 0 | - | |
| 0 1 | 0 1 | |
| 1 0 | 0 0 | 1 1 |
| 1 1 | 1 0 | |

| A B | Primary a b | Alternate a b |
|---|---|---|
| 0 0 | 1 0 | |
| 0 1 | - | |
| 1 0 | 0 1 | |
| 1 1 | 0 0 | 1 1 |

| A B | Primary a b | Alternate a b |
|---|---|---|
| 0 0 | 0 0 | 1 1 |
| 0 1 | - | |
| 1 0 | 0 1 | |
| 1 1 | 1 0 | |

| A B | Primary a b | Alternate a b |
|---|---|---|
| 0 0 | 1 0 | |
| 0 1 | 0 0 | 1 1 |
| 1 0 | - | |
| 1 1 | 0 1 | |

| A B | Primary a b | Alternate a b |
|---|---|---|
| 0 0 | 0 1 | |
| 0 1 | 1 0 | |
| 1 0 | 0 0 | 1 1 |
| 1 1 | - | |

| A B | Primary a b | Alternate a b |
|---|---|---|
| 0 0 | - | |
| 0 1 | 0 1 | |
| 1 0 | 1 0 | |
| 1 1 | 0 0 | 1 1 |

| A B | Primary a b | Alternate a b |
|---|---|---|
| 0 0 | 0 0 | 1 1 |
| 0 1 | - | |
| 1 0 | 1 0 | |
| 1 1 | 0 1 | |

| A B | Primary a b | Alternate a b |
|---|---|---|
| 0 0 | 0 1 | |
| 0 1 | 0 0 | 1 1 |
| 1 0 | - | |
| 1 1 | 1 0 | |

| A B | Primary a b | Alternate a b |
|---|---|---|
| 0 0 | 1 0 | |
| 0 1 | 0 1 | |
| 1 0 | 0 0 | 1 1 |
| 1 1 | - | |

| A B | Primary a b | Alternate a b |
|---|---|---|
| 0 0 | - | |
| 0 1 | 1 0 | |
| 1 0 | 0 1 | |
| 1 1 | 0 0 | 1 1 |

Fig. 3B

CIRCUIT ARRANGEMENT AND METHOD FOR CODING AND/OR DECODING

CROSS-REFERENCE TO RELATED APPLICATIONS

This application is a continuation of international (WO) patent application no. PCT/DE2012/200056, filed 16 Aug. 2012, which claims the priority of German (DE) patent application no. 10 2011 052 766.4, filed 16 Aug. 2011, the contents of each being hereby incorporated herein by reference.

FIELD OF THE INVENTION

The present invention relates principally to the technical field of optical and/or electrical, in particular serialised, signal links; more particularly, the present invention relates to a circuit arrangement and to a method for coding and/or decoding a data stream, in particular of up to 24-bit-wide R[ed]G[reen]B[lue] video signals.

BACKGROUND OF THE INVENTION

Displays in mobile phones, in notebooks or in portable game consoles, are controlled among others by a parallel data bus, which receives the information via the colour bits and the necessary synchronisation bits. If this data is transmitted in parallel, this parallel data transmission requires a broad flat ribbon cable or a relatively large amount of space on a printed circuit board, thereby preventing such devices from being minituarised any further.

There exist method for serialising this parallel data and then deserialise it, but only a few of these conventional methods are suitable for a D[irect]C[urrent]-balanced data transmission.

Methods which guarantee such a DC-balanced data transmission, have a big surplus of serial bits to be additionally transmitted due to the coding and decoding method used. For if this data is serialised and deserialised, a large amount of additional bits is either additionally transmitted due to the conventionally used coding and decoding methods, or more than one differential line is required for transmitting the data and the associated clock signal, whereby the aim of minitiarising such devices is again thwarted.

In order to receive a DC-balanced signal coding and decoding methods with different bit widths are employed. The most well known coding/deconding method is 8b/10b coding/decoding (8b=eight bit, 10b=ten bit). In most cases such 8b/10b coding/decoding comprises
 a 5b/6b-coder block with associated 6b/5b decoder block and
 a 3b/4b-coder block with associated 4b/3b decoder block.

The basis used for such 5b/6b blocks and 3b/4b blocks is usually the instructions and the table of Albert X. Widmer (IBM Research Division). As regards the asppropriate technological background of the present invention reference can be made to the prior art publication U.S. Pat. No. 6,911,921 B2.

OBJECTS AND SUMMARY OF THE INVENTION

Starting from the above-explained disadvantages and inadequacies as well as taking the outlined prior art into account the object of the present invention is to further develop a circuit arrangement of the above-mentioned type and a method of the above-mentioned type in such way that an efficient DC-balanced coding and/or decoding is possible, in particular with the lowest possible overheads.

This object is achieved by a circuit arrangement according to the invention with the herein described features and by a method according to the invention with the herein described features, in particular by the coding and/or decoding, for example of 24 Bit-R[ed]G[reen]B[lue] video signals, using 27 Bit/32 Bit coding/decoding, by means of which it is possible to code and/or to decode the data to be transmitted in such way that only very few additional bits are incurred for a DC-balanced serial optical and/or electrical data connection or transmission; data overheads incurred are therefore very small.

Advantageous embodiments and expedient further developments of the present invention are described above and below.

This object is achieved by a circuit arrangement provided for coding and/or decoding a data stream, in particular of up to 24-bit-wide R[ed]G[reen]B[lue] video signals, comprising
 at least one coder
  with five 5b/6b coder blocks arranged in parallel to each other and
  with a 2b/2b coder block arranged in parallel to the 5b/6b coder blocks, and/or
 at least one decoder
  with five 6b/5b decoder blocks arranged in parallel to each other and
  with a 2b/2b decoder block arranged in parallel to the 6b/5b decoder blocks.

This object is further achieved by an embodiment of the circuit arrangement according to the invention,
 wherein the 5b/6b coder block comprises at least one data input and at least one data output,
 wherein the 2b/2b coder block comprises at least one data input and at least one data output,
 wherein the 6b/5b decoder block comprises at least one data input and at least one data output, and
 wherein the 2b/2b decoder block comprises at least one data input and at least one data output.

This object is further achieved by an embodiment of the circuit arrangement according to the invention,
 wherein the 5b/6b coder block comprises at one disparity input for at least one incoming disparity information D_in and at least one disparity output for the outgoing disparity information D_out and
 wherein the 2b/2b coder block comprises at least one disparity output for the incoming disparity information D_in and at least one disparity output for the outgoing disparity information D_out.

This object is further achieved by an embodiment of the circuit arrangement according to the invention, wherein the disparity information D_in, when passing each of the 5b/6b coder blocks and when passing the 2b/2b coder block, remains unchanged (D_out=D_in) or is inverted (D_in=0→D_out=1 or D_in=1→D_out=0) depending on the D[irect]C[urrent]-balancing of the data signal going out from the respective 5b/6b coder block and from the 2b/2b coder block.

This object is further achieved by an embodiment of the circuit arrangement according to the invention,
 wherein the 6b/5b decoder block comprises at least one disparity input for at least one incoming disparity information D_in and at least one disparity output for the outgoing disparity information D_out, and wherein the 2b/2b decoder block comprises at least one disparity input for the incoming disparity information D_in and at least one disparity output for the outgoing disparity information D_out.

This object is further achieved by an embodiment of the circuit arrangement according to the invention, wherein the disparity information D_in when passing each of the 6b/5b decoder blocks and when passing the 2b/2b decoder block remains unchanged (D_out=D_in) or is inverted (D_in=0→D_out=1 order D_in=1→D_out=0) depending on the D[irect]C[urrent]-balancing of the data signal arriving in the respective 6b/5b decoder block and in the 2b/2b decoder block.

This object is further achieved by an embodiment of the circuit arrangement according to the invention, wherein of four possible input signals 00, 01, 10, 11, three input signals can be used, in particular as a DC-balanced signal, for the data input of the 2b/2b coder block or of the 2b/2b decoder block utilising the disparity information D_in, D_out.

This object is further achieved by an embodiment of the circuit arrangement according to the invention, wherein the data input of the 2b/2b coder block or the 2b/2b decoder block can be acted upon by
at least one D[ata]E[nable] signal, and
at least one H[orizontal]S[ynchronisation] signal.

This object is further achieved by an embodiment of the circuit arrangement according to the invention,
wherein at least one multiplexer, in particular at least one 32-to-1 multiplexer, is arranged downstream of the coder, wherein the data stream outputted by the coder can be serialised by means of the multiplexer, and
wherein at least one demultiplexer, in particular at least one 1-to-32 demultiplexer, is arranged upstream of the decoder, wherein the serial data stream outputted by the multiplexer can be deserialised by means of said demultiplexer.

This object is achieved by a method for coding and/or decoding a data stream, in particular of up to 24-bit-wide R[ed]G[reen]B[lue] videosignals, said method comprising:
the coding
using five 5b/6b coder blocks and
using one 2b/2b coder block arranged in parallel to the 5b/6b coder blocks, and/or
the decoding
using five 6b/5b decoder blocks arranged in parallel to each other and
using one 2b/2b decoder block arranged in parallel to the 6b/5b decoder blocks.

This object is further achieved by an embodiment of the method according to the invention,
wherein during passing each of the 5b/6b coder blocks and during passing of the 2b/2b coder block a disparity information D_in remains unchanged (D_out=D_in) or is inverted (D_in=0→D_out=1 or D_in=1→D_out=0) depending on the D[irect]C[urrent]-balancing of the data signal going out from the respective 5b/6b coder block and from the 2b/2b coder block, and
wherein during passing each of the 6b/5b decoder blocks and during passing of the 2b/2b decoder block a disparity information D_in remains unchanged (D_out=D_in) or is inverted (D_in=0→D_out=1 or D_in=1→D_out=0) depending on the D[irect]C[urrent]-balancing of the data signal arriving in the respective 6b/5b decoder block and in the 2b/2b decoder block.

This object is further achieved by an embodiment of the method according to the invention, wherein of four possible input signals 00, 01, 10, 11, three input signals are used, in particular as a DC-balanced signal, for the data input of the 2b/2b coder block or of the 2b/2b decoder block utilising the disparity information D_in, D_out.

This object is further achieved by an embodiment of the method according to the invention, wherein the data input of the 2b/2b coder block or the 2b/2b decoder block is acted upon
by at least one D[ata]E[nable] signal, and
by at least one H[orizontal]S[ynchronisation] signal.

This object is further achieved by an embodiment of the method according to the invention,
wherein the data stream outputted by the coder is serialised by means of at least one multiplexer, in particular by means of at least one 32-to-1 multiplexer, arranged downstream of the coder, and
wherein the serial data stream outputted by the multiplexer is deserialised by means of at least one demultiplexer, in particular by means of at least one 1-to-32 demultiplexer, arranged upstream of the decoder.

This object is further achieved by a use of the circuit arrangement and/or of the method according to the invention for the serialised optical and/or electrical signal transmission between at least one up to 24-bit-wide digital R[ed]G[reen]B[lue] data source, in particular at least one, for example high-resolution camera and/or a camera acting as an image source, or at least one application processor, and at least one up to 24-bit-wide digital R[ed]G[reen]B[lue] data sink, in particular at least one application processor or at least one, for example high-resolution display or monitor and/or a display or monitor acting for example as an image sink.

By means of the present invention it is possible, on the one hand, to produce a 32 bit long data word which is suitable for DC-balanced serial data transmission, and on the other, to decode a 32 Bit long data word into an error-free 27 Bit wide data word.

According to the invention this is accomplished using
five 5b/6b-coder blocks and one 2b/2b coder block on the coding side and
five 6b/5b decoder blocks and one 2b/2b decoder block on the decoding side, wherein the 5b/6b code (also 5b6b code) is a line code, in which 5 bit data is coded with six bit so that on the one hand, a DC current compensation is ensured and that on the other clock recovery from the data signal is possible.

The data stream generated by means of 5b/6b-coding has an overhead of twenty percent relative to the original data stream, which, however, is progress in comparison to the also commonly used 4b/5b coding insofar as with 4b/5b coding the gross data rate relative to the net or usable data rate (so-called pay load) is raised by 25 percent due to the data overhead.

The 2b/2b coder block and 2b/2b decoder block also used according to the invention ensure under usage of the disparity information that of four possible input information (i.e. 00, 01, 10, 11) three can be used for generating a DC-balanced signal.

This usage of three out of four possible input signals is conveniently possible, if the D[ata]E[nable] signal and the H[orizontal]S[ynchronisation] signal are connected to the two data inputs, wherein reference may be made to the methodology according to VESA-Standard; see http://www.vesa.org/

The present invention provides a possibility to reduce the number of coded bits to be transmitted and which have been serialised by means of at least one multiplexing downstream of this coding, without reducing the transmitted usable data quantity; this again results in the required gross data transmission rate being reduced, which in turn results in a reduced power consumption of a serial data transmission.

As an example the present invention can be used in bundled or serialised optical and/or electrical signal transmission between at least one up to 24-bit-wide digital R[ed]G[reen]B[lue] data source, in particular at least one, for example, high-resolution camera acting for example as an image source, or at least one application processor, and at least one up to 24-bit-wide digital R[ed]G[reen]B[lue] data sink, in particular at least one application processor or at least one, for example high-resolution display or monitor acting for example as an image sink.

In principle it is possible, to realise and to operate the signal link
- on an optical basis, in particular on the basis of at least one medium, for example on the basis of at least one optical waveguide, such as on the basis of at least one glass fibre and/or plastic fibre, and/or
- on an electrical or galvanic basis, in particular on the basis of at least one electrical or galvanic link, for example on the basis of at least one copper cable and/or on the basis of at least one electrical line arranged e.g. on at least one printed circuit board.

BRIEF DESCRIPTION OF THE DRAWINGS

As already discussed above, there are various possibilities for embodying and further developing the teaching of the present invention in an advantageous manner. For this purpose, on the one hand reference is made to the explanations above and to the dependent claims, and on the other hand further embodiments, features and advantages of the present invention are explained in greater detail below, inter alia by way of the exemplary embodiments illustrated by FIG. 1A to FIG. 3B.

It is shown in:

FIG. 2 an embodiment of a 5b/6b coding table relating back to Albert X. Widmer (IBM Research Division), by means of which five input bits can be converted into six output bits and which can be used when implementing the present invention;

FIG. 3A an embodiment of one of in total 24 possible 2b/2b coding tables, by means of which two input bits can be converted into two output bits and which can be used when implementing the present invention; and FIG. 3B the further 23 possible 2b/2b coding tables, which are of equal value to the 2b/2b coding table in FIG. 3A and by means of which two input bits can be converted into two output bits.

Like or similar embodiments, elements or features are provided with identical reference numerals in FIG. 1 to FIG. 3B.

DETAILED DESCRIPTION OF THE INVENTION

Figure 1:
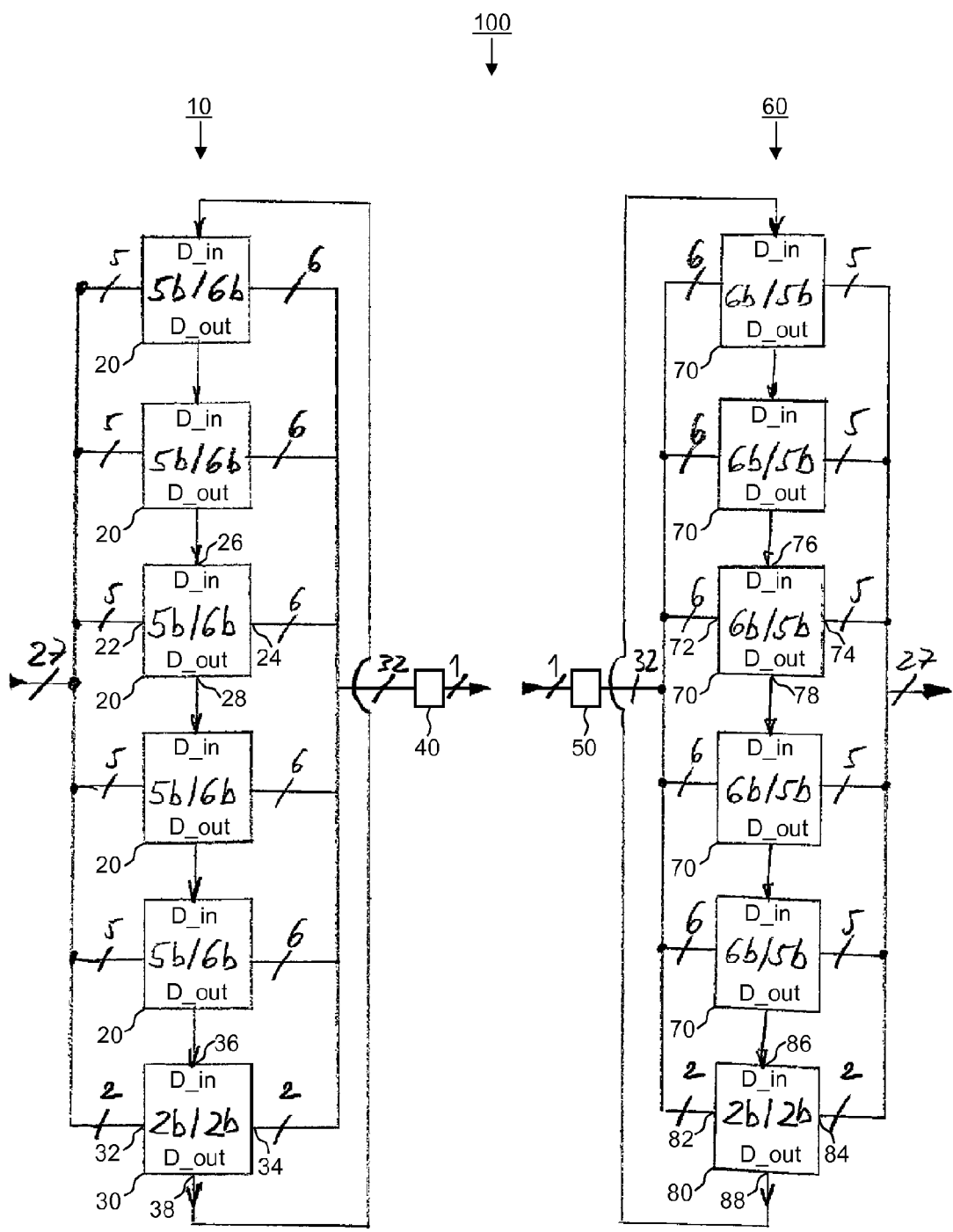
FIG. 1 in a conceptual schematic illustration an embodiment of a circuit arrangement according to the present invention, which operates according to the method of the present invention.

By means of the circuit arrangement 100 shown in FIG. 1 according to the present invention a data stream of up to 24-bit-wide R[ed]G[reen]B[lue] video signals can be coded (←→ coder 10) and decoded (←→ decoder 60).

To this end the circuit arrangement 100 comprises
on the coding side the coder 10
with five 5b/6b coder blocks 20 arranged in parallel to each other and
with a 2b/2b coder block 30 arranged in parallel to the 5b/6b coder blocks 20 as well as
on the decoding side a decoder 60
with five 6b/5b decoder blocks 70 arranged in parallel to each other and
with a 2b/2b decoder block 80 arranged in parallel to the 6b/5b decoder blocks 70.

By means of the coder 10 it is possible to generate a data stream comprising a sequence of a random amount of 32-bit-long data words, which is suitable for a DC balanced serialised data transmission between the coder 10 and the decoder 60. Serialisation is realised by means a 32-to-1 multiplexer 40 (so-called Mux), which is arranged downstream of the coder 10 and ensures that the data stream can be output in a serial sequence.

To effect the coding each of the five 5b/6b coder blocks 20 can pick up five-bit-wide digital signals at its data input 22 and convert them into six bit wide signals which are output by the respective data output 24 (the reference numerals 22, 24 in FIG. 1 are shown by way of the central one of the five 5b/6b coder blocks 20, but apply analogously to all five 5b/6b coder blocks 20).

Further each of the 5b/6b coder blocks 20 comprises a disparity input 26 for the incoming disparity information D_in and a disparity output 28 for the outgoing disparity information D_out because—in addition to the data—also the disparity is processed (the reference numerals 26, 28 in FIG. 1 are shown by way of the central one of the five 5b/6b coder blocks 20, but apply analogously to all five 5b/6b coder blocks 20).

For this 5b/6b conversion, as an example, the coding table shown in FIG. 2 by Albert X. Widmer (IBM Research Division) can be used. As such, in FIG. 2, the five individual bits of the 5 bit input words are denoted with the letters A, B, C, D, E; further, in FIG. 2, the six individual bits of the 6-bit output words are denoted with the letters a, b, c, d, e, i. Using the exemplary coding table of FIG. 2 therefore, the 5b/6b coding method represents 5-bit words A B C D E arriving via the data input 22 in the form of 6-bit symbols a b c d e i going out via the data output 24.

Of the 32 5-bit input words A B C D E to be transmitted a part is converted into 6-bit output symbols a b c d e i, which contain an identical number of zeros and ones, i.e. respectively three zeros and three ones and consequently are denoted as balanced or D[irect]C[urrent] balanced or D[irect]C[urrent] neutral, and can thus be transmitted as DC-neutral. As such, as an example according to the coding table in FIG. 2, nineteen of the 32 5-bit input words to be transmitted are converted into DC-neutrally transmittable 6-bit output symbols a b c d e i.

The remaining part of the 32 5-bit input words A B C D E to be transmitted is converted into 6-bit output symbols, which do not contain an identical number of zeros and ones, but
either four zeros and two ones
or two zeros and four ones
and are consequently denoted as unbalanced or D[irect]C[urrent] unbalanced or not-D[irect]C[urrent]-neutral, i.e. when taken in isolation, would not be DC-neutrally transmittable.

Therefore, as an example according to the coding table in FIG. 2, thirteen of the 32 5-bit input words A B C D E are converted into 6-bit output symbols a b c d e i which are not DC-neutrally transmittable. For these thirteen input words A B C D E there are respectively two possible output symbols, i.e. primary a b c d e i and alternate a b c d e i. As to whether the first output symbol, i.e. primary a b c d e i, or the second output symbol, i.e. alternate a b c d e i is used, depends on the respectively previously sent unbalanced output symbol.

A 2b/2b coder block 30 is connected in parallel to the five 5b/6b coder blocks 20, which also comprises a data input 32 and a data output 34. Further, the 2b/2b coder block 30 comprises a disparity input 36 for the incoming disparity information D_in and a disparity output 38 for the outgoing disparity information D_out because—in addition to the data—also the disparity is processed.

This 2b/2b conversion may be for example accomplished using the coding table shown in FIG. 3A. The further 23 possible 2b/2b coding tables, which are on a par with the 2b/2b coding table in FIG. 3A and by means of which two input bits can be converted into two output bits, are illustrated in FIG. 3B.

As such, in FIG. 3A, the two individual bits of the 2-bit input words are denoted with the letters A, B; further, in FIG. 3A, the two individual bits of the 2-Bit output words are denoted with the letters a, b. On the basis of the exemplary coding table of FIG. 3A therefore, the 2b/2b coding method represents 2-bit words A B arriving via the data input 32 in the form of 2-bit symbols a b going out via the data output 34.

Of the four 2-bit input words A B, a part is converted into 2-bit output symbols a b, which contain an identical number of zeros and ones, i.e. respectively one zero and one, and consequently are denoted as balanced or D[irect]C[urrent]-balanced or D[irect]C[urrent]-neutral, i.e. can be DC-neutrally transmitted. As such, according to the exemplary coding table in FIG. 3A, the two 2-bit input words 0 1 (i.e. A=0, B=1) and 1 0 (i.e. A=1, B=0), which are to be transmitted, are converted into DC-neutrally transmittable 2-bit output symbols 0 1 (i.e. a=0, b=1) and 1 0 (i.e. a=1, b=0).

Of the remaining part of the 2-bit input words A B, according to the coding table in FIG. 3A, one is converted into 2-bit output symbols a b, which do not contain an identical number of zeros and ones, but
    either two zeros
    or two ones
and are conseaquently denoted as unbalanced or D[irect]C[urrent]-unbalanced or not-D[irect]C[urrent]-neutral, i.e. taken in isolation, would not be DC-neutrally transmittable.

As such, according to the coding table in FIG. 3A, the 2-bit input word 0 0 to be transmitted (i.e. A=0, B=0) is converted into a not DC-neutrally transmittable 2-bit output symbol 0 0 (i.e. a=0, b=0) or 1 1 (i.e. a=1, b=1). For this input symbol 0 0 (i.e. A=0, B=0) there are two possible output symbols, that is primary a b (=0 0) and alternate a b (=1 1). As to whether the first output symbol, i.e. primary a b, or the second output symbol, i.e. alternate a b, is used, depends on the respectively previously sent unbalanced output symbol.

The fourth (=in the embodiment of FIG. 3A the 2-bit input word 1 1, i.e. A=1, B=1) of the four 2-bit input words A B, is not needed or not used according to the exemplary coding table in FIG. 3A. The 2b/2b coder block 30 therefore ensures, using the disparity information, that three (i.e. 0 0, 0 1, 1 0) of four possible 2-bit input words A B (=0 0, 0 1, 1 0, 1 1) are used or worked into the 32-bit output data word in such a way, that the output data stream composed of a serial sequence of such 32-bit output data words is always DC-balanced independently of the 27 input signals to be coded.

The restriction to three out of the four possible input signals 0 0, 0 1, 1 0, 1 1 at the input of the 2b/2b coder block 30 is advantageously possible in particular when the D[ata]E[nable] signal and the H[orizontal]S[ynchronisation] signal are connected to the two data inputs 32 and data outputs 34, for these two signals can be communicated without temporal coincidence.

The decision,
    whether via the 5b/6b coder block 20
        that unbalanced 6-bit output symbol a b c d e i with four zeros and two ones or
        that unbalanced 6-bit output symbol a b c d e i with two zeros and four ones, or
    whether via the 2b/2b coder block 30
        that unbalanced 2-bit output symbol a b with two zeros and no ones or
        that unbalanced 2-bit output symbol a b with no zeros and two ones
is transmitted, is determined by way of the incoming disparity information D_in. By means of this technical measure unbalanced 6-bit output symbols a b c d e i can be transmitted via the 5b/6b coding block 20 or unbalanced 2-bit output symbols a b can be transmitted via the 2b/2b coding block 30, respectively potential-free.

For this purpose, during the transmission of sequential unbalanced output symbols, respectively one symbol from the one group (=with a surplus of two zeros, i.e. with two zeros and four ones in the case of an unbalanced 6-bit output symbol a b c d e i or with two zeros and no ones in the case of an unbalanced 2-bit output symbol a b) followed by a symbol from the other group (=with a surplus of two ones, i.e. with two zeros and four ones in the case of an unbalanced 6-bit output symbol a b c d e i or with no zeros and two ones in the case of an unbalanced 2-bit output symbol a b) is alternately transmitted. In this way, when averaged over time, a balanced bit sequence consisting of zeros and ones and therefore a DC-free transmission occurs.

Each of the 5b/6b coder blocks 20 as well as the 2b/2b coder block 30 of the coder 10 is notified via the respective disparity input 26 or 36 by way of the incoming disparity information D_in, whether the output symbol a b, if it is not DC-balanced, shall comprise
    negative disparity, i.e. two zeros more than ones, i.e.
        four zeros and two ones in the case of the 5b/6b coder block 20 or
        two zeros and no ones in the case of the 2b/2b coder block 30, or
    positive disparity, i.e. two ones more than zeros, i.e.
        two zeros and four ones in the case of the 5b/6b coder block 20 or
        no zeros and two ones in the case of the 2b/2b coder block 30.

In such a case of outputting a not DC-balanced output symbol the state of the disparity information configured as a binary signal (=0 or 1) is inverted, i.e.
    the disparity information D_in=0 arriving at the disparity input 26 or 36 becomes the disparity information D_out=1 going out at the disparity output 28 or 38 or
    the disparity information D_in=1 arriving at the disparity input 26 or 36 becomes the disparity information D_out=0 going out at the disparity output 28 or 38.
Thereby it is determined which disparity the following or next unbalanced outputted symbol shall comprise, wherein the disparity information,
    in the case of a DC-balanced outputted symbol, is forwarded as unchanged disparity information (D_out=D_in) and in the case of a not DC-balanced outputted symbol, is forwarded as inverted disparity information (D_in=0→D_out=1 or D_in=1→D_out=0) by each of the five 5b/6b coder blocks 20 and by the 2b/2b coder block 30 and from there is forward further again to the first (the topmost in FIG. 1) of the five 5b/6b coder blocks 20.

Therefore, if an unbalanced output symbol has negative parity, i.e. two zeros more than ones, i.e.

four zeros and two ones in the case of the 5b/6b coder block 20 or two zeros and no ones in the case of the 2b/2b coder block 30, the disparity information coming from the previous output symbol is inverted and forwarded to the next coder block 20 or 30, which depending on whether its output symbol is unbalanced or balanced, re-inverts the state of the disparity information or leaves it unchanged; in particular the following unbalanced output symbol is generated with positive disparity.

If, on the other hand, an unbalanced output symbol has positive parity, i.e. two ones more than zeros, i.e.

two zeros and four ones in the case of the 5b/6b coder block 20 or no zeros and two ones in the case of the 2b/2b coder block 30, the disparity information coming from the previous output symbol is forwarded inverted to the next coder block 20 or 30, which depending on whether its output symbol is unbalanced or balanced, re-inverts the state of the disparity information or leaves it unchanged; in particular the following unbalanced output symbol is generated with negative parity.

If finally the output symbol has neutral disparity, i.e. the output symbol is DC-balanced, the so disparity information coming from the previous output symbol is forwarded unchanged to the next coding block 20 or 30, which depending on whether its output symbol is balanced or unbalanced, leaves the state of the disparity information again unchanged or inverts it.

The choice, whether the primary output word or the alternate output word is output in the exemplary coding tables of FIG. 2 and FIG. 3A, FIG. 3B in the case of an unbalanced output word, is determined by the state of the incoming disparity information D_in, such that that disparity of the output symbols or output words, which can be selected, is output, which is inverse to the disparity of the previous unbalanced output symbol or output word.

Using this approach it is ensured that DC-freedom is achieved across a sufficiently large quantity of output symbols.

Any number of balanced output symbols can be present between two unbalanced output symbols, for example no symbol, one symbol, several or many balanced output symbols between two unbalanced output symbols.

The construction and the function of the decoder 60 are essentially mirror images of the above described construction and function of the coder 10:

By means of the decoder 60 decoding of the DC-balanced data stream provided by the coder 10 can be realised in a 27-bit-wide error-free data stream.

After the data stream coming from the coder 10 and serialised by means of the multiplexer 40 is again deserialised initially by means of a 1-to-32 demultiplexer 50 (so-called demux) upstream of the decoder 60 into a width of 32 Bit, each of the five 6b/5b decoder blocks 70 can pick up 6-bit-wide digital signals through its data input 72 for decoding and convert them into a 5-bit-wide digital word, which is output via the respective data output 74 (in FIG. 1 the reference numerals 72, 74 are shown by way of the central one of the five 6b/5b decoder blocks 70, but they analogously apply to all five 6b/5b decoder blocks 70).

Further, each of the five 6b/5b decoder blocks 70 comprises a disparity input 76 for the incoming disparity information D_in and a disparity output 78 for the outgoing disparity information D_out because—in addition to the data—also the disparity is processed (in FIG. 1 the reference numerals 76, 78 are shown by way of the central one of the five 6b/5b decoder blocks 70, but they analogously apply to all five 6b/5b decoder blocks 70).

A 2b/2b decoder block 80 is connected in parallel to the five 6b/5b decoder blocks 70, which also comprises a data input 82 and a data output 84. Further the 2b/2b decoder block 80 comprises a disparity input 86 for the incoming disparity information D_in and a disparity output 88 for the outgoing disparity information D_out because—in addition to the data—also the disparity is processed.

As regards the decoding side (shown in the right half of FIG. 1), in respect of forwarding the disparity information, whether in the form of leaving unchanged for a balanced symbol or a balanced word or in the form of inverting for an unbalanced symbol or unbalanced word, the above explanations given for the coding side (shown in the left half of FIG. 1) shall apply throughout.

LIST OF REFERENCE NUMERALS 100 circuit arrangement
10 coder
20 5b/6b coder block of coder 10
22 data input of 5b/6b coder block 20
24 data output of 5b/6b coder block 20
26 disparity input of 5b/6b coder block 20
28 disparity output of 5b/6b coder block 20
30 2b/2b coder block of coder 10
32 data input of 2b/2b coder block 30
34 data output of 2b/2b coder block 30
36 disparity input of 2b/2b coder block 30
38 disparity output of 2b/2b coder block 30
40 multiplexer, in particular 32-to-1 multiplexer
50 demultiplexer, in particular 1-to-32 demultiplexer
60 decoder
70 6b/5b decoder block of decoder 60
72 data input of 6b/5b decoder block 70
74 data output of 6b/5b decoder block 70
76 disparity input of 6b/5b decoder block 70
78 disparity output of 6b/5b decoder block 70
80 2b/2b decoder block of decoder 60
82 data input of 2b/2b decoder block 80
84 data output of 2b/2b decoder block 80
86 disparity input of 2b/2b decoder block 80
88 disparity output of 2b/2b decoder block 80
D_in incoming disparity information
D_out outgoing disparity information While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A circuit arrangement provided for coding and decoding a data stream, comprising:
   at least one coder
      with five 5b/6b coder, five bit encoded to six bit, blocks arranged in parallel to each other and
      with a 2b/2b coder, two bit encoded to two bit, block arranged in parallel to the 5b/6b coder blocks, and
   at least one decoder
      with five 6b/5b decoder, six bit decoded to five bit, blocks arranged in parallel to each other and
      with a 2b/2b decoder, two bit decoded to two bit, block arranged in parallel to the 6b/5b decoder blocks,
   wherein the 5b/6b coder block comprises at one disparity input for at least one incoming disparity information D_in and at least one disparity output for the outgoing disparity information D_out,
   wherein the 2b/2b coder block comprises at least one disparity output for the incoming disparity information D_in and at least one disparity output for the outgoing disparity information D_out, and
   wherein the disparity information D_in, when passing each of the 5b/6b coder blocks and when passing the 2b/2b coder block, remains unchanged (D_out=D_in) or is inverted (D_in=0→D_out=1 or D_in=1→D_out=0) depending on the D[irect]C[urrent]-balancing of the data signal going out from the respective 5b/6b coder block and from the 2b/2b coder block.

2. The circuit arrangement according to claim 1,
   wherein the 5b/6b coder block comprises at least one data input and at least one data output,
   wherein the 2b/2b coder block comprises at least one data input and at least one data output,
   wherein the 6b/5b decoder block comprises at least one data input and at least one data output, and
   wherein the 2b/2b decoder block comprises at least one data input and at least one data output.

3. The circuit arrangement according to claim 1,
   wherein the 6b/5b decoder block comprises at least one disparity input for at least one incoming disparity information D_in and at least one disparity output for the outgoing disparity information D_out, and
   wherein the 2b/2b decoder block comprises at least one disparity input for the incoming disparity information D_in and at least one disparity output for the outgoing disparity information D_out.

4. A circuit arrangement provided for coding and decoding a data stream, comprising:
   at least one coder
      with five 5b/6b coder, five bit encoded to six bit, blocks arranged in parallel to each other and
      with a 2b/2b coder, two bit encoded to two bit, block arranged in parallel to the 5b/6b coder blocks, and
   at least one decoder
      with five 6b/5b decoder, six bit decoded to five bit, blocks arranged in parallel to each other and
      with a 2b/2b decoder, two bit decoded to two bit, block arranged in parallel to the 6b/5b decoder blocks,
   wherein the 6b/5b decoder block comprises at least one disparity input for at least one incoming disparity information D_in and at least one disparity output for the outgoing disparity information D_out,
   wherein the 2b/2b decoder block comprises at least one disparity input for the incoming disparity information D_in and at least one disparity output for the outgoing disparity information D_out, and
   wherein the disparity information D_in when passing each of the 6b/5b decoder blocks and when passing the 2b/2b decoder block remains unchanged (D_out=D_in) or is inverted (D_in=0→D_out=1 or D_in=1→D_out=0) depending on the D[irect]C[urrent]-balancing of the data signal arriving in the respective 6b/5b decoder block and in the 2b/2b decoder block.

5. The circuit arrangement according to claim 2, wherein of four possible input signals 00, 01, 10, 11, three input signals can be used for the data input of the 2b/2b coder block or of the 2b/2b decoder block utilizing the disparity information D_in, D_out.

6. The circuit arrangement according to claim 1, wherein of four possible input signals 00, 01, 10, 11, three input signals can be used for the data input of the 2b/2b coder block or of the 2b/2b decoder block utilizing the disparity information D_in, D_out.

7. The circuit arrangement according to claim 5, wherein the data input of the 2b/2b coder block or the 2b/2b decoder block can be acted upon by
   at least one D[ata]E[nable] signal, and
   at least one H[orizontal]S[ynchronization] signal.

8. The circuit arrangement according to claim 1,
   wherein at least one multiplexer is arranged downstream of the coder, wherein the data stream outputted by the coder can be serialized by means of the multiplexer, and
   wherein at least one demultiplexer is arranged upstream of the decoder, wherein the serial data stream outputted by the multiplexer can be deserialized by means of said demultiplexer.

9. A method for coding and decoding a data stream by means of at least one circuit arrangement according to claim 1, said method comprising:
   the coding
      using the five 5b/6b coder blocks and
      using the 2b/2b coder block arranged in parallel to the 5b/6b coder blocks, and
   the decoding
      using the five 6b/5b decoder blocks arranged in parallel to each other and
      using the 2b/2b decoder block arranged in parallel to the 6b/5b decoder blocks,
   wherein during passing each of the 5b/6b coder blocks and during passing of the 2b/2b coder block a disparity information D_in remains unchanged (D_out=D_in) or is inverted (D_in=0→D_out=1 or D_in=1→D_out=0) depending on the D[irect]C[urrent]-balancing of the data signal going out from the respective 5b/6b coder block and from the 2b/2b coder block, and
   wherein during passing each of the 6b/5b decoder blocks and during passing of the 2b/2b decoder block a disparity information D_in remains unchanged (D_out=D_in) or is inverted (D_in =0→D_out=1 or D_in=1→D_out=0) depending on the D[irect]C[urrent]-balancing of the data signal arriving in the respective 6b/5b decoder block and in the 2b/2b decoder block.

10. The method according to claim 9, wherein of four possible input signals 00, 01, 10, 11, three input signals are used for the data input of the 2b/2b coder block or of the 2b/2b decoder block utilizing the disparity information D_in, D_out.

11. The method according to claim 10, wherein the data input of the 2b/2b coder block or the 2b/2b decoder block is acted upon
by at least one D[ata]E[nable] signal, and
by at least one H[orizontal]S[ynchronization] signal.

12. The method according claim 9,
wherein the data stream outputted by the coder is serialized by means of at least one multiplexer arranged downstream of the coder, and
wherein the serial data stream outputted by the multiplexer is deserialized by means of at least one demultiplexer arranged upstream of the decoder.

13. Use of at least one circuit arrangement according to claim 1 for the serialized optical and electrical signal transmission between at least one up to 24-bit-wide digital R[ed]G[reen]B[lue] data source and at least one up to 24-bit-wide digital R[ed]G[reen]B[lue] data sink.

* * * * *